(12) United States Patent
Lee et al.

(10) Patent No.: US 7,061,268 B1
(45) Date of Patent: Jun. 13, 2006

(54) INITIALIZING A CARRY CHAIN IN A PROGRAMMABLE LOGIC DEVICE

(75) Inventors: Andy L. Lee, San Jose, CA (US); Ninh Ngo, San Jose, CA (US); Vaughn Betz, Toronto (CA); David Lewis, Toronto (CA); Bruce Pedersen, Sunnyvale, CA (US); James Schleicher, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 2 days.

(21) Appl. No.: 10/801,242

(22) Filed: Mar. 15, 2004

(51) Int. Cl.
*H03K 19/177* (2006.01)

(52) U.S. Cl. .................... 326/39; 326/41; 708/505; 708/670

(58) Field of Classification Search ............ 326/37–41, 326/53; 708/505, 670
See application file for complete search history.

(56) References Cited

U.S. PATENT DOCUMENTS

| | | | |
|---|---|---|---|
| 5,258,668 A | 11/1993 | Cliff | |
| 5,274,581 A | 12/1993 | Cliff | |
| 5,295,090 A | 3/1994 | Hsieh | |
| 5,349,250 A | 9/1994 | New | |
| 5,359,242 A | 10/1994 | Veenstra | |
| 5,365,125 A | 11/1994 | Goetting | |
| 5,481,206 A | 1/1996 | New | |
| 5,481,486 A | 1/1996 | Cliff | |
| 5,483,478 A | 1/1996 | Chiang | |
| 5,500,608 A | 3/1996 | Goetting | |
| 5,523,963 A | 6/1996 | Hsieh | |
| 5,546,018 A | 8/1996 | New | |
| 5,629,886 A | 5/1997 | New | |
| 5,631,576 A | 5/1997 | Lee | |
| 5,672,985 A | 9/1997 | Lee | |
| 5,675,262 A | 10/1997 | Duong | |
| 5,724,276 A | 3/1998 | Rose | |
| 5,761,099 A | 6/1998 | Pedersen | |
| 5,818,255 A | 10/1998 | New | |
| RE35,977 E | 12/1998 | Cliff | |
| 5,889,411 A | 3/1999 | Chaudhary | |
| 5,898,318 A | 4/1999 | Pedersen | |
| 5,898,319 A | 4/1999 | New | |
| 5,898,602 A | 4/1999 | Rothman | |
| 6,107,827 A | 8/2000 | Young | |
| 6,154,052 A | 11/2000 | New | |
| 6,154,053 A | 11/2000 | New | |
| 6,157,209 A | 12/2000 | McGettigan | |
| 6,288,570 B1 | 9/2001 | New | |
| 6,323,680 B1 * | 11/2001 | Pedersen et al. .............. | 326/41 |
| 6,359,468 B1 | 3/2002 | Park | |

* cited by examiner

*Primary Examiner*—Vibol Tan
(74) *Attorney, Agent, or Firm*—Beyer Weaver & Thomas, LLP

(57) ABSTRACT

A logic circuit includes a first series of logic elements. Each logic element has a look-up table (LUT) and a dedicated adder to implement an arithmetic mode in the logic element. The logic circuit also includes a carry chain connecting the first series of logic element, and an initialization circuit connected to the carry chain to initialize the carry chain.

27 Claims, 13 Drawing Sheets

INITIALIZING A CARRY CHAIN IN A PROGRAMMABLE LOGIC DEVICE

BACKGROUND

1. Field of the Invention

The present application relates to programmable logic devices, and more particularly to initializing a carry chain in a programmable logic device.

2. Related Art

A programmable logic device ("PLD") is a digital, user-configurable integrated circuit used to implement a custom logic function. For the purposes of this description, the term PLD encompasses any digital logic circuit configured by the end-user, and includes a programmable logic array ("PLA"), a field programmable gate array ("FPGA"), and an erasable and complex PLD. The basic building block of a PLD is a logic element (LE) that is capable of performing logic functions on a number of input variables. A LE is typically equipped with circuitry to programmably implement the "sum of products" logic or look-up table logic, as well as one or more registers to implement sequential logic. Conventional PLDs combine together large numbers of such logic elements through an array of programmable interconnects to facilitate implementation of complex logic functions. PLDs have found particularly wide application as a result of their combined low up front cost and versatility to the user.

In a typical PLD architecture, an arithmetic mode of the LE is provided to implement faster arithmetic. In this mode, carry-chain logic is used between LEs to provide a fast rippling carry chain through a series of LEs, with each LE implementing a bit-slice of the arithmetic.

For example, with reference to FIG. 1, a typical PLD architecture 100 is depicted. PLD architecture 100 includes an array of logic elements (LEs) 102. Sets of LEs 102 are grouped together as logic array blocks (LABs) 104. A LAB 104 includes a carry chain 108, which connects the set of LEs in LAB 104. As depicted in FIG. 1, a carry-input signal ($C_{in}$) enters through the first LE 102 in LAB 104, propagates serially through each LE 102, then a carry-out signal ($C_{out}$) exits through the last LE 102.

As described above, a LE is typically equipped to implement look-up table (LUT) logic. Because the arithmetic mode of the LE typically relies on using programmable LUT logic, a carry-chain is typically initialized for the first bit of arithmetic in a given arithmetic chain by modifying the LUT programming for the first bit of arithmetic. However, if the arithmetic logic is implemented without using LUT logic, the carry chain needs to be initialized entering the first bit of arithmetic in a given carry chain.

As also depicted in FIG. 1, PLD architecture 100 includes a number of input lines 106 into LAB 104. The number of input lines 106 for a LAB 104 is typically determined based on the typical usage rather than the maximum usage of LAB 104. Thus, a complex arithmetic operation may require more inputs per LE 102 than the typical usage, which can result in insufficient number of input lines 106 to fully support the carry chain.

SUMMARY

In one exemplary embodiment, a logic circuit includes a first series of logic elements. Each logic element has a look-up table (LUT) and a dedicated adder to implement an arithmetic mode in the logic element. The logic circuit also includes a carry chain connecting the first series of logic element, and an initialization circuit connected to the carry chain to initialize the carry chain.

DESCRIPTION OF DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

I. Initializing Carry Chain

Figure 1:
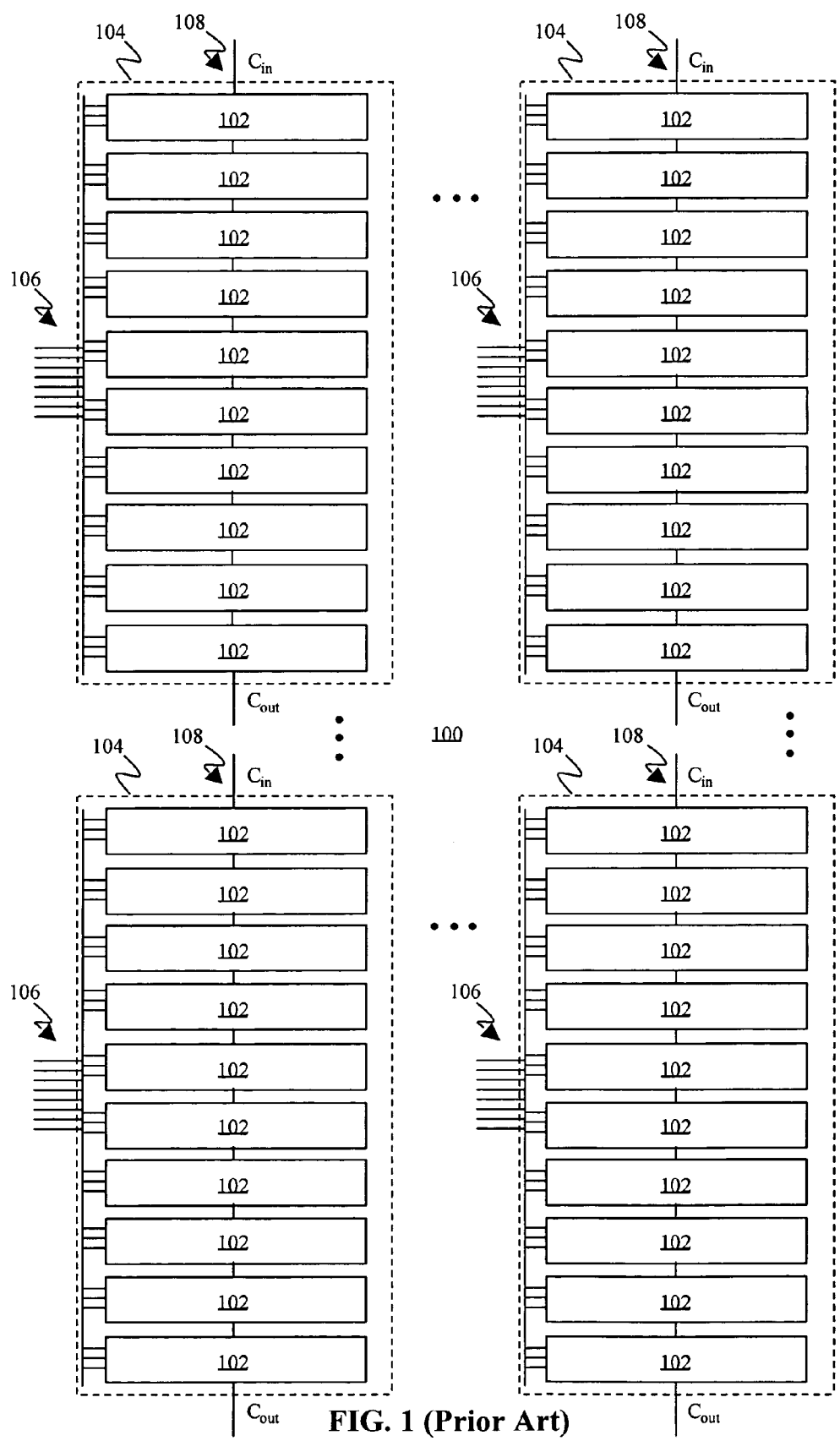
FIG. 1 is a block diagram of a conventional programmable logic device (PLD) architecture.
Figure 2:
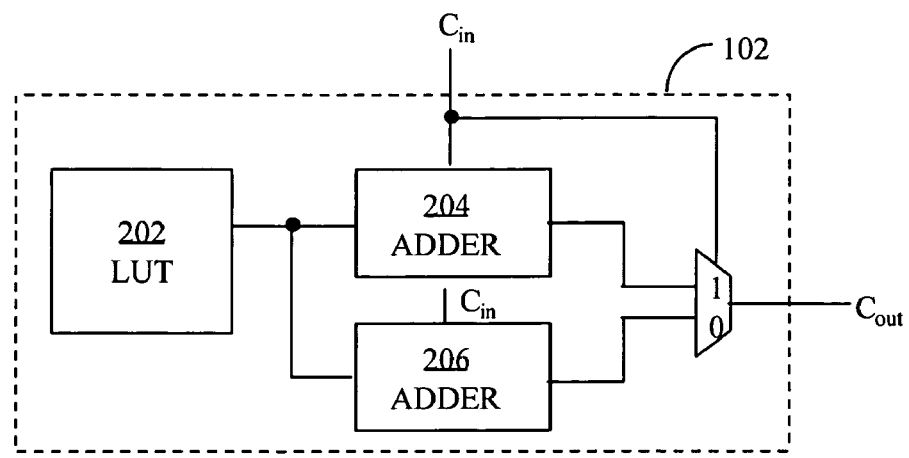
FIG. 2 is a block diagram of a logic element (LE) in a PLD.

With reference to FIG. 2, in one exemplary embodiment, a LE 102 is depicted with non-LUT-based arithmetic support. More particularly, LE 102 includes a LUT 202 and dedicated adders 204 and 206. In the present exemplary embodiment, dedicated adders 204 and 206 are used to implement the arithmetic mode in LE 102 rather than LUT 202. In the exemplary embodiment depicted in FIG. 2, adders 204 and 206 are hard-logic full adders with 3 inputs. It should be recognized that LE 102 can include any number of LUTs 202 and adders 204 and 206 in various configurations.

Figure 3:
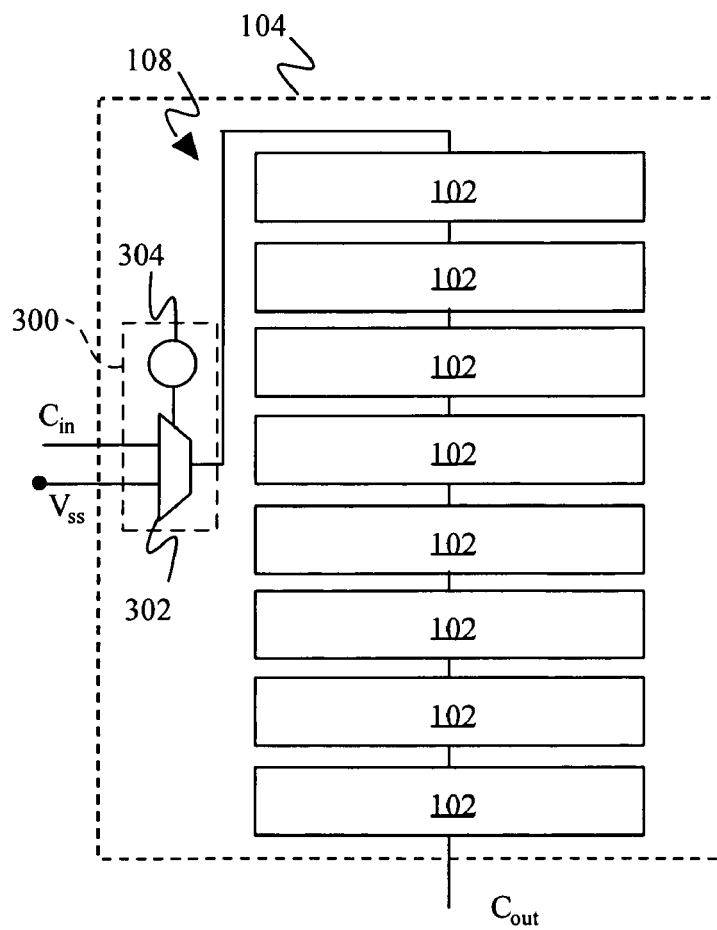
FIGS. 3–11 are block diagrams of exemplary logic array blocks (LABs) with carry chains and initialization circuits.

With reference to FIG. 3, a LAB 104 includes a set of LEs 102 and a carry chain 108, which serially connects the set of LEs 102 within LAB 104. It should be recognized that the set of LEs 102 depicted in FIG. 3 can include dedicated adders 204 and/or 206 (FIG. 2) to implement the arithmetic mode in the set of LEs 102.

In one exemplary embodiment, carry chain 108 includes an initialization circuit 300 configured to initialize carry chain 108 in LAB 104. More particularly, initialization circuit 300 is configured to introduce a logic zero to the beginning of carry chain 108 in LAB 104, which corresponds to the first LE 102 in LAB 104.

As depicted in FIG. 3, in the present exemplary embodiment, initialization circuit 300 includes a multiplexer 302 with a first input connected to a carry input ($C_{in}$) signal and a second input connected to a power supply (e.g., $V_{ss}$ or $V_{cc}$). Multiplexer 302 is also connected to a random access memory (RAM) bit 304, which provides an initialization signal, to select between the first input and the second input. When the first input is selected, carry chain 108 in LAB 104 receives the carry input signal, which can propagate a carry signal from a preceding carry chain 108 in a preceding LAB 104. When the second input is selected, carry chain 108 in LAB 104 receives a logic zero, which initializes carry chain 108 in LAB 104.

II. Bypass-able Carry Chain

Figure 4:
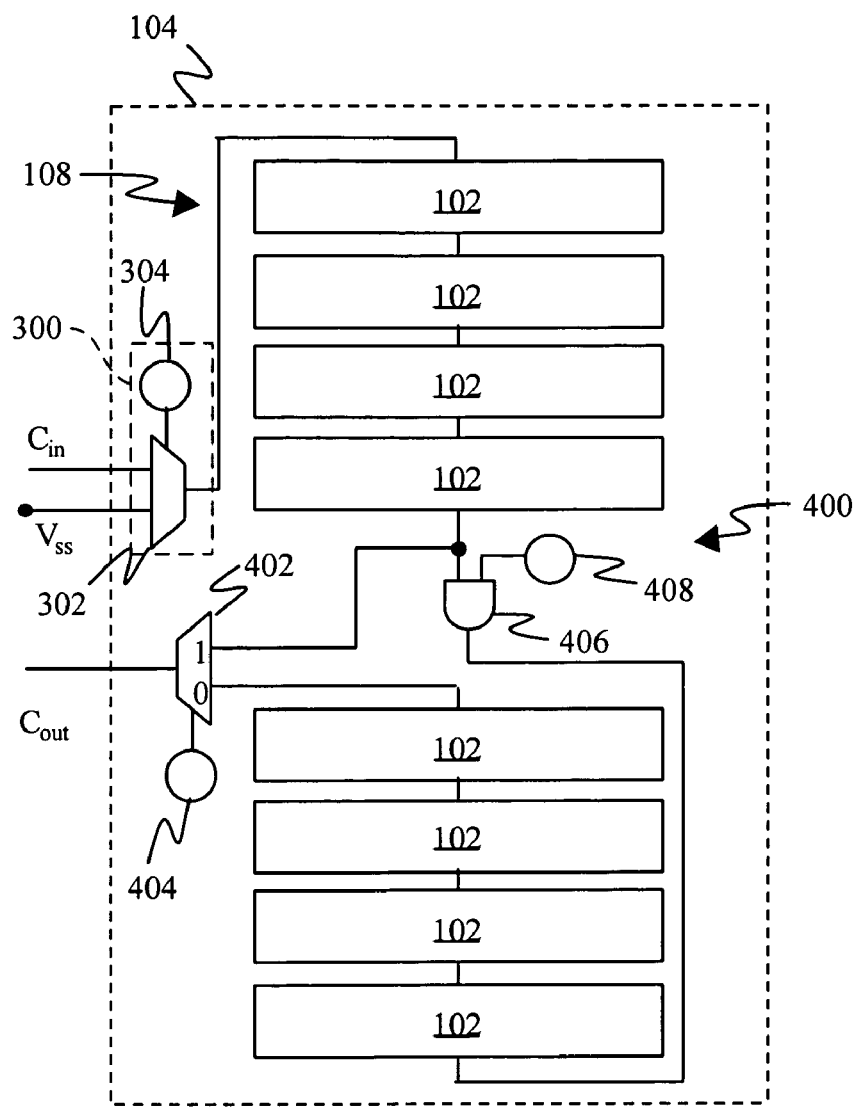

With reference to FIG. 4, in one exemplary embodiment, a LAB 104 includes a bypass-able carry chain 108. More particularly, carry chain 108 includes a first path connecting a first series of LEs 102 in LAB 104, where the LEs 102 in the first series is a subset of the LEs 102 in LAB 104. Carry chain 108 also includes a second path connecting a second series of LEs 102 in LAB 104, where one or more of the LEs 102 in the second series are not in the first series. In the present exemplary embodiment, the LEs 102 in the first series are a subset of the LEs 102 in the second series.

As depicted in FIG. 4, in the present exemplary embodiment, the first path includes only the top four LEs 102 in LAB 104. In the present exemplary embodiment, the second path includes the top four and bottom four LEs 102 in LAB 104. It should be recognized that LAB 104 can include any number of LEs 102, and the first path can include any number of LEs 102, which are a subset of the set of LEs 102 in LAB 104. Additionally, it should be recognized that any number of LABs 104 can be arranged in an array as part of an exemplary PLD architecture.

In the present exemplary embodiment, carry chain 108 includes one or more logic components to select between the first path and the second path. More particularly, in the exemplary embodiment depicted in FIG. 4, carry chain 108 includes a multiplexer 402 connected to a RAM bit 404 to select between a first input and a second input. Thus, carry chain 108 can be operated in a first mode and a second mode. When carry chain 108 is operated in the first mode, the first input of multiplexer 402 is selected and the carry signal is propagated through the first series of LEs 102. When carry chain 108 is operated in the second mode, the second input of multiplexer 402 is selected and the carry signal is propagated through the second series of LEs 102.

Again, as depicted in FIG. 4, when carry chain 108 is operated in the first mode, the carry signal propagates through only the top four of the eight LEs 102 in LAB 104. When carry chain 108 is operated in the second mode, the carry signal propagates through all eight LEs 102 in LAB 104. Thus, carry chain 108 is a bypass-able carry chain in that the bottom four LEs 102 in LAB 104 can be bypassed or excluded from carry chain 108.

In some applications, such as when the number of input lines into LAB 104 is sufficient for the arithmetic operation to be performed, all of the LEs 102 in LAB 104 can be used as part of carry chain 108 to perform the arithmetic operation. However, in some applications, such as when the number of input lines in LAB 104 is insufficient for the arithmetic operation to be performed, a subset of the LEs 102 in LAB 104 can be used as part of carry chain 108 to perform the arithmetic operation. The LEs 102 that are bypassed from carry chain 108 can then be used for various functions other than the arithmetic function being performed by carry chain 108. For example, the LEs 102 that are bypassed can be used in a logic mode while the LEs 102 in carry chain 108 can be used in an arithmetic mode. For a more detailed description of a bypass-able carry chain, see co-pending U.S. patent application Ser. No. (To Be Assigned), entitled BYPASS-ABLE CARRY CHAIN IN A PROGRAMMABLE LOGIC DEVICE, filed on Mar. 12, 2004, the entire content of which is incorporated herein by reference.

In the present exemplary embodiment, carry chain 108 includes a first initialization circuit 300 and a second initialization circuit 400. The first initialization circuit 300 is configured to initialize the first path of carry chain 108. The second initialization circuit 400 is configured to initialize the second path of carry chain 108. Thus, in the present exemplary embodiment, carry chain 108 can be initialized at two locations.

As depicted in FIG. 4, in the present exemplary embodiment, first initialization circuit 300 includes a multiplexer 302 with a first input connected to a carry input ($C_{in}$) signal and a second input connected to a power supply (e.g., $V_{ss}$ or $V_{cc}$). Multiplexer 302 is also connected to a random access memory (RAM) bit 304, which provides an initialization signal, to select between the first input and the second input. When the first input is selected, the first path of carry chain 108 in LAB 104 receives the carry input signal, which can propagate a carry signal from a preceding carry chain 108 in a preceding LAB 104. When the second input is selected, the first path in carry chain 108 in LAB 104 receives a logic zero, which initializes the first path in carry chain 108 in LAB 104.

As also depicted in FIG. 4, in the present exemplary embodiment, second initialization circuit 400 includes a logic gate 406 connected to a RAM bit 408, which provides an initialization signal. To initialize the second path of carry chain 108, logic gate 406 outputs a logic zero into the second path of carry chain 108. Although logic gate 406 is depicted in FIG. 4 as an AND gate, it should be recognized that logic gate 406 can include various types and combinations of logic gates, such as a NAND gate.

III. Location of Bypass-able Portion

In the exemplary embodiment depicted in FIG. 4, the bottom portion of LAB 104 is bypass-able, meaning that one or more LEs 102 located in the bottom portion of LAB 104 can be bypassed from carry chain 108. It should be recognized, however, that the bypass-able portion of carry chain 108 can be located at any location within LAB 104.

Figure 5:
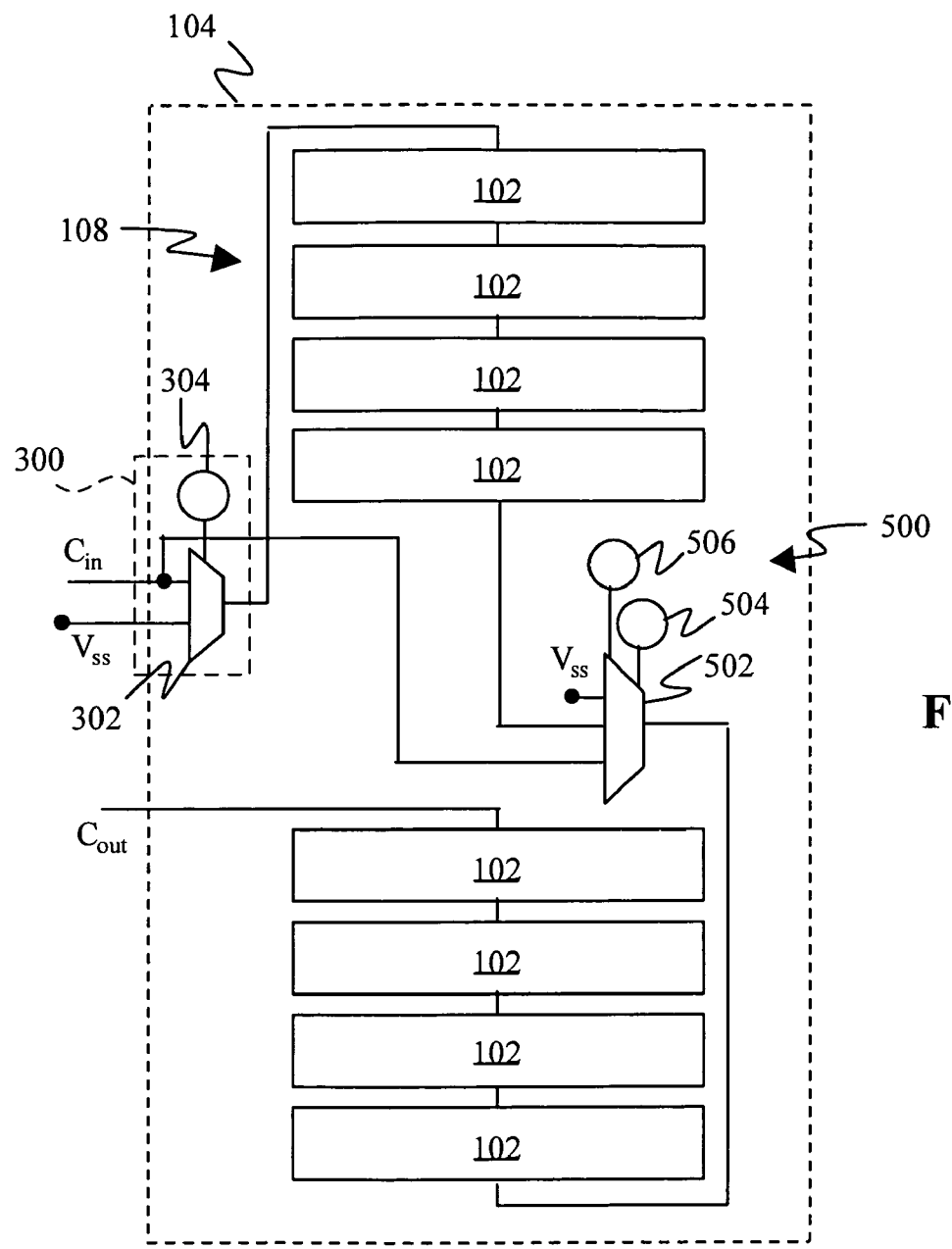

For example, in another exemplary embodiment depicted in FIG. 5, the bypass-able portion of carry chain 108 is located at the top of LAB 104. More particularly, carry chain 108 includes a multiplexer 502 connected to a RAM bit 504 to select between a first input and a second input. When carry chain 108 is operated in a first mode, the first input of multiplexer 502 is selected and a carry signal is propagated through a first series of LEs 102. When carry chain 108 is operated in a second mode, the second input of multiplexer 502 is selected and a carry signal is propagated through a second series of LEs 102, where one or more of the LEs 102 in the second series are not in the first series. In the present exemplary embodiment, the LEs 102 in the first series are a subset of the LEs 102 in the second series.

Carry chain 108 also includes a first initialization circuit 300 and a second initialization circuit 500. The first initialization circuit 300 is configured to initialize the first path of carry chain 108. The second initialization circuit 500 is configured to initialize the second path of carry chain 108. Thus, in the present exemplary embodiment, carry chain 108 can be initialized at two locations.

As depicted in FIG. 5, in the present exemplary embodiment, first initialization circuit 300 includes a multiplexer 302 with a first input connected to a carry input ($C_{in}$) signal and a second input connected to a power supply (e.g., $V_{ss}$ or $V_{cc}$). Multiplexer 302 is also connected to a random access memory (RAM) bit 304, which provides an initialization signal, to select between the first input and the second input. When the first input is selected, the first path of carry chain 108 in LAB 104 receives the carry input signal, which can propagate a carry signal from a preceding carry chain 108 in a preceding LAB 104. When the second input is selected, the first path in carry chain 108 in LAB 104 receives a logic zero, which initializes the first path in carry chain 108 in LAB 104.

As also depicted in FIG. 5, in the present exemplary embodiment, second initialization circuit 500 includes a RAM bit 506, which provides an initialization signal, connected to multiplexer 502, which includes an input connected to a power supply (e.g., $V_{ss}$ or $V_{cc}$). To initialize the second path of carry chain 108, multiplexer 502 outputs a logic zero into the second path of carry chain 108.

Figure 6:
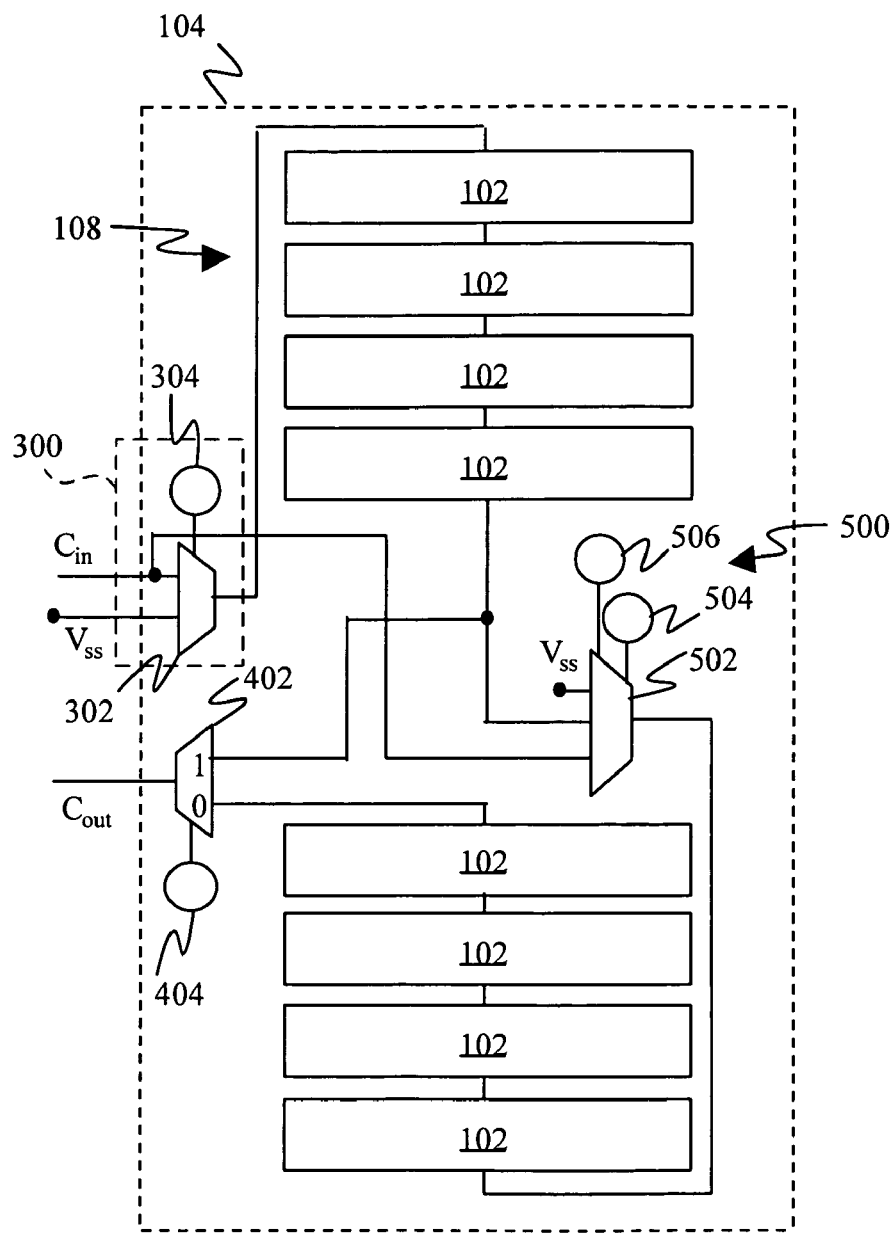

In still another exemplary embodiment depicted in FIG. 6, the bypass-able portion of carry chain 108 is selectable between a first location and a second location within LAB 104. More particularly, carry chain 108 includes a first multiplexer 402 connected to a first RAM bit 404 to select between a first input and a second input of first multiplexer 402. Carry chain 108 also includes a second multiplexer 502 connected to a second RAM bit 504 to select between a first input and a second input of second multiplexer 502. The first multiplexer 402 can be used to bypass a first series of LEs 102 located in the top portion of LAB 104. The second multiplexer 502 can be used to bypass a second series of LEs 102 located in the bottom portion of LAB 104.

Carry chain 108 also includes a first initialization circuit 300 and a second initialization circuit 500. The first initialization circuit 300 is configured to initialize the first path of carry chain 108. The second initialization circuit 500 is configured to initialize the second path of carry chain 108. Thus, in the present exemplary embodiment, carry chain 108 can be initialized at two locations.

As depicted in FIG. 6, in the present exemplary embodiment, first initialization circuit 300 includes a multiplexer 302 with a first input connected to a carry input ($C_{in}$) signal and a second input connected to a power supply (e.g., $V_{ss}$ or $V_{cc}$). Multiplexer 302 is also connected to a random access memory (RAM) bit 304, which provides an initialization signal, to select between the first input and the second input. When the first input is selected, the first path of carry chain 108 in LAB 104 receives the carry input signal, which can propagate a carry signal from a preceding carry chain 108 in a preceding LAB 104. When the second input is selected, the first path in carry chain 108 in LAB 104 receives a logic zero, which initializes the first path in carry chain 108 in LAB 104.

As also depicted in FIG. 6, in the present exemplary embodiment, second initialization circuit 500 includes a RAM bit 506, which provides an initialization signal, connected to multiplexer 502, which includes an input connected to a power supply (e.g., $V_{ss}$ or $V_{cc}$). To initialize the second path of carry chain 108, multiplexer 502 outputs a logic zero into the second path of carry chain 108.

IV. Row Redundancy

Figure 7:
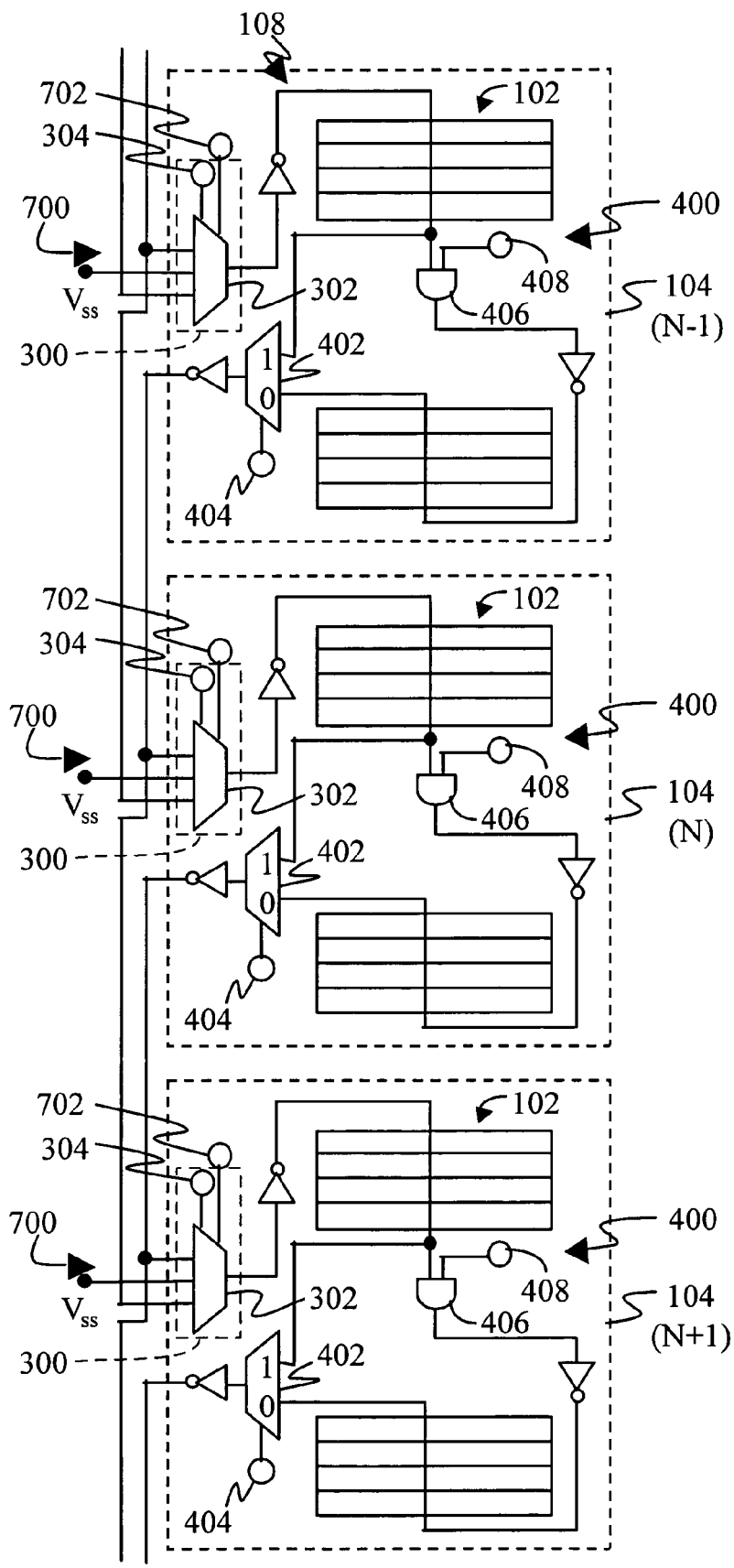

With reference to FIG. 7, in one exemplary embodiment, LAB 104 includes carry chain 108, first initialization circuit 300, second initialization circuit 400, and a redundancy circuit 700. It should be recognized that carry chain 108, first initialization circuit 300, second initialization circuit 400, and redundancy circuit 700 can share components. For example multiplexer 302 is a component of both first initialization circuit 300 and redundancy circuit 700.

As described above, an exemplary PLD architecture can includes an array of LEs 102 and LABs 104. In the present exemplary embodiment, redundancy circuit 700 can be used to skip a LAB 104 in a column of LABs 104.

More particularly, redundancy circuit 700 includes multiplexer 302 connected to a redundancy signal 702 to switch between a first input and a second input. The first input is connected to the output of carry chain 108 from a preceding LAB 104 in a preceding row. The second input is connected to the first input of a multiplexer 702 from a redundancy circuit 700 in a preceding LAB 104 in a preceding row. The output of multiplexer 302 is connected to carry chain 108. Thus, carry chain 108 can receive, as an input, the output of carry chain 108 from a preceding LAB 104 in a preceding row, which continues the carry chain from the preceding LAB 104. Alternatively, carry chain 108 can receive, as an input, the input into the redundancy circuit 700 in the preceding LAB 104 in the preceding row, which results in the preceding LAB 104 in the preceding row being skipped.

For example, as depicted in FIG. 7, a first input of multiplexer 302 in LAB 104 (N) is connected to the output of carry chain 108 from preceding LAB 104 (N-1) in a preceding row. A second input of multiplexer 302 in LAB 104 (N) is connected to input of multiplexer 302 in preceding LAB 104 (N-1). Thus, when the first input of multiplexer 302 in LAB 104 (N) is selected using redundancy signal 702, the output of carry chain 108 from preceding LAB 104 (N-1) is propagated to carry chain 108 in LAB 104 (N). However, when the second input of multiplexer 302 in LAB 104 (N) is selected using redundancy signal 702, the input of multiplexer 302 in the preceding LAB 104 (N-1) is received as an input to carry chain 108 in LAB 104 (N), which results in carry chain 108 in the preceding LAB 104 (N-1) being skipped.

In the present exemplary embodiment, redundancy signal 702 can be created from hardware that determines if a row of LABs 104 is defective and needs to be skipped. For example, laser-programmed fuses can be used to determine if a row of LABs 104 is defective during initialization of the device.

In the present exemplary embodiment, carry chain 108 includes a first initialization circuit 300 and a second initialization circuit 400. The first initialization circuit 300 is configured to initialize the first path of carry chain 108. The second initialization circuit 400 is configured to initialize the second path of carry chain 108. Thus, in the present exemplary embodiment, carry chain 108 can be initialized at two locations.

As depicted in FIG. 7, in the present exemplary embodiment, first initialization circuit 300 includes multiplexer 302 with a third input connected to a power supply (e.g., $V_{ss}$ or $V_{cc}$). Multiplexer 302 is also connected to a random access memory (RAM) bit 304, which provides an initialization signal, to select between the first input and the second input. When the third input is selected, the first path in carry chain 108 in LAB 104 receives a logic zero, which initializes the first path in carry chain 108 in LAB 104.

As also depicted in FIG. 7, in the present exemplary embodiment, second initialization circuit 400 includes a logic gate 406 connected to a RAM bit 408, which provides an initialization signal. To initialize the second path of carry chain 108, logic gate 406 outputs a logic zero into the second path of carry chain 108. Although logic gate 406 is depicted in FIG. 7 as an AND gate, it should be recognized that logic gate 406 can include various types and combinations of logic gates, such as a NAND gate.

In the exemplary embodiment depicted in FIG. 7, the bypass-able portion of carry chain 108 is located in the bottom portion of LAB 104. As noted earlier, it should be recognized that the bypass-able portion of carry chain 108 can be located at various locations of LAB 104.

Figure 8:
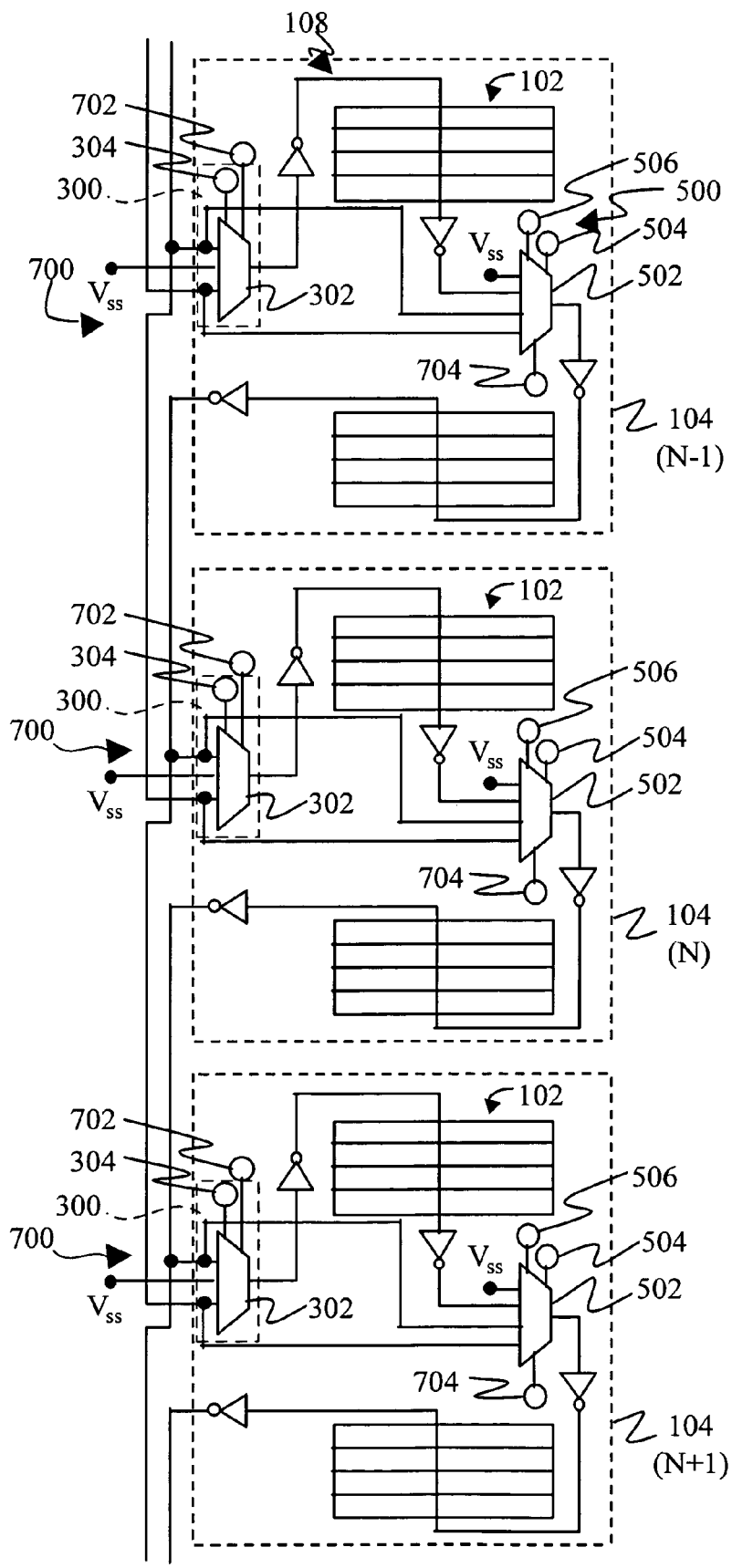

For example, in another exemplary embodiment depicted in FIG. 8, redundancy circuit 700 is connected to a carry chain 108 with a bypass-able portion located at the top portion of LAB 104. In the present exemplary embodiment, carry chain 108 includes a 4:1 multiplexer 502 connected to a RAM bit 506, a RAM bit 504, and a redundancy signal 704 to select between a first input, a second input, a third input, and a fourth input. When the second path of carry chain 108 is initialized, the first input of multiplexer 502 is selected. When the preceding LAB 104 (N-1) is not skipped and the bypass-able portion located at the top portion of LAB 104 (N) is not bypassed, the second input of multiplexer 502 is selected and a carry signal is propagated from carry chain 108 from the preceding LAB 104 (N-1) through a first set of LEs 102 in LAB 104 (N). When the preceding LAB 104 (N-1) is skipped and the bypass-able portion located at the top portion of LAB 104 (N) is not bypassed, the second input of multiplexer 502 is also selected. When the preceding LAB 104 (N-1) is not skipped and the bypass-able portion located at the top portion of LAB 104 (N) is bypassed, the third input of multiplexer 502 is selected and a carry signal is propagated from carry chain 108 from the preceding LAB 104 (N-1) through a second set of LEs 102 in LAB 104 (N), where the second set of LEs 102 is a subset of the LEs 102 in the first set of LEs 102. When the preceding LAB 104 (N-1) is skipped and the bypass-able portion located at the top portion of LAB 104 (N) is bypassed, the fourth input of multiplexer 502 is selected and a carry signal is propagated from the first input of redundancy circuit 700 from a preceding LAB 104 (N-1) in a preceding row through the second set of LEs 102 in LAB 104 (N).

Carry chain 108 includes a first initialization circuit 300 and a second initialization circuit 500. The first initialization circuit 300 is configured to initialize the first path of carry chain 108. The second initialization circuit 500 is configured to initialize the second path of carry chain 108. Thus, in the present exemplary embodiment, carry chain 108 can be initialized at two locations.

As depicted in FIG. 8, in the present exemplary embodiment, first initialization circuit 300 includes multiplexer 302 with a third input connected to a power supply (e.g., $V_{ss}$ or $V_{cc}$). Multiplexer 302 is also connected to a random access memory (RAM) bit 304. When the third input is selected, the first path in carry chain 108 in LAB 104 receives a logic zero, which initializes the first path in carry chain 108 in LAB 104.

As also depicted in FIG. 8, in the present exemplary embodiment, second initialization circuit 500 includes a RAM bit 506, which provides an initialization signal, connected to multiplexer 502, which includes an input connected to a power supply (e.g., $V_{ss}$ or $V_{cc}$). To initialize the second path of carry chain 108, multiplexer 502 outputs a logic zero into the second path of carry chain 108.

Figure 9:
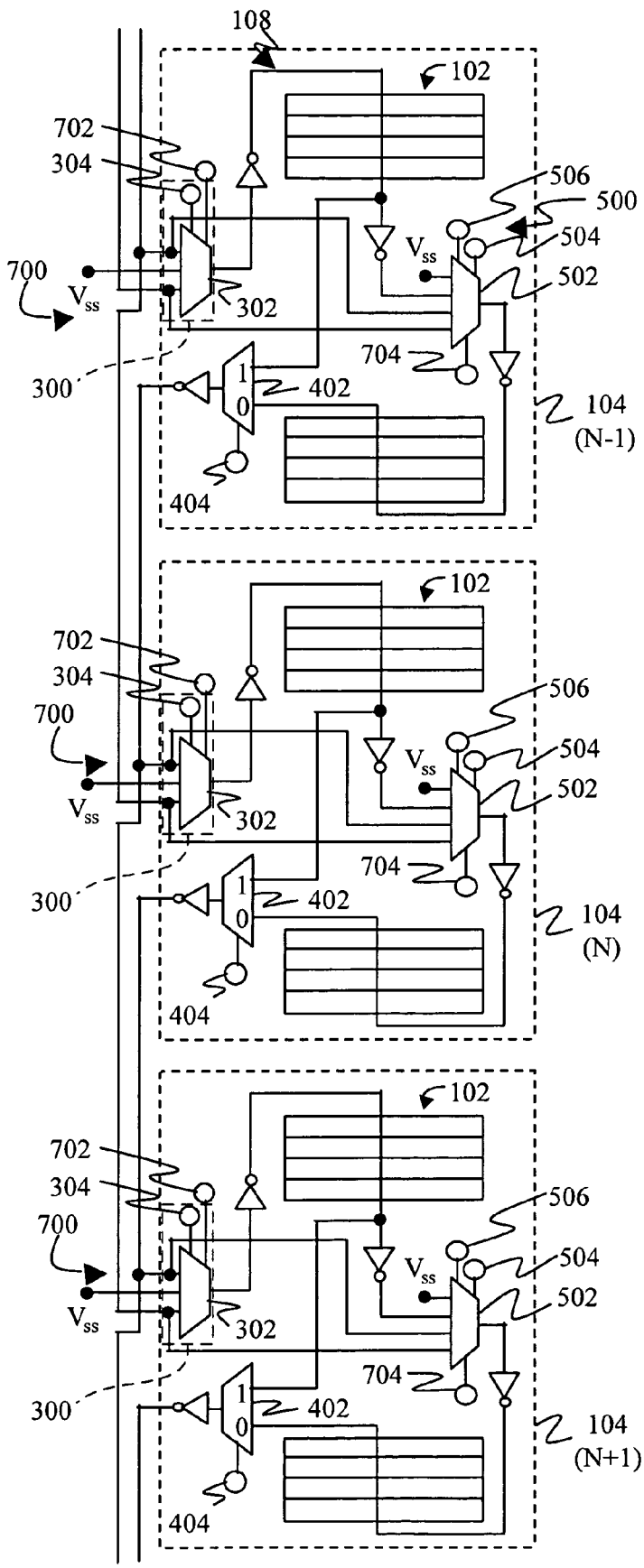

In still another exemplary embodiment depicted in FIG. 9, redundancy circuit 700 is connected to a carry chain 108 with a bypass-able portion that is selectable between a first location and a second location within LAB 104. More particularly, in addition to multiplexer 502, which is described above, carry chain 108 includes multiplexer 402, which can be used to bypass one or more LEs 102 located in the bottom portion of LAB 104.

Carry chain 108 includes a first initialization circuit 300 and a second initialization circuit 500. The first initialization circuit 300 is configured to initialize the first path of carry chain 108. The second initialization circuit 500 is configured to initialize the second path of carry chain 108. Thus, in the present exemplary embodiment, carry chain 108 can be initialized at two locations.

As depicted in FIG. 9, in the present exemplary embodiment, first initialization circuit 300 includes multiplexer 302 with a third input connected to a power supply (e.g., $V_{ss}$ or $V_{cc}$). Multiplexer 302 is also connected to a random access memory (RAM) bit 304, which provides an initialization signal. When the third input is selected, the first path in carry chain 108 in LAB 104 receives a logic zero, which initializes the first path in carry chain 108 in LAB 104.

As also depicted in FIG. 9, in the present exemplary embodiment, second initialization circuit 500 includes a RAM bit 506, which provides an initialization signal, connected to multiplexer 502, which includes an input connected to a power supply (e.g., $V_{ss}$ or $V_{cc}$). To initialize the second path of carry chain 108, multiplexer 502 outputs a logic zero into the second path of carry chain 108.

V. Initialization Value Selection

Figure 10:
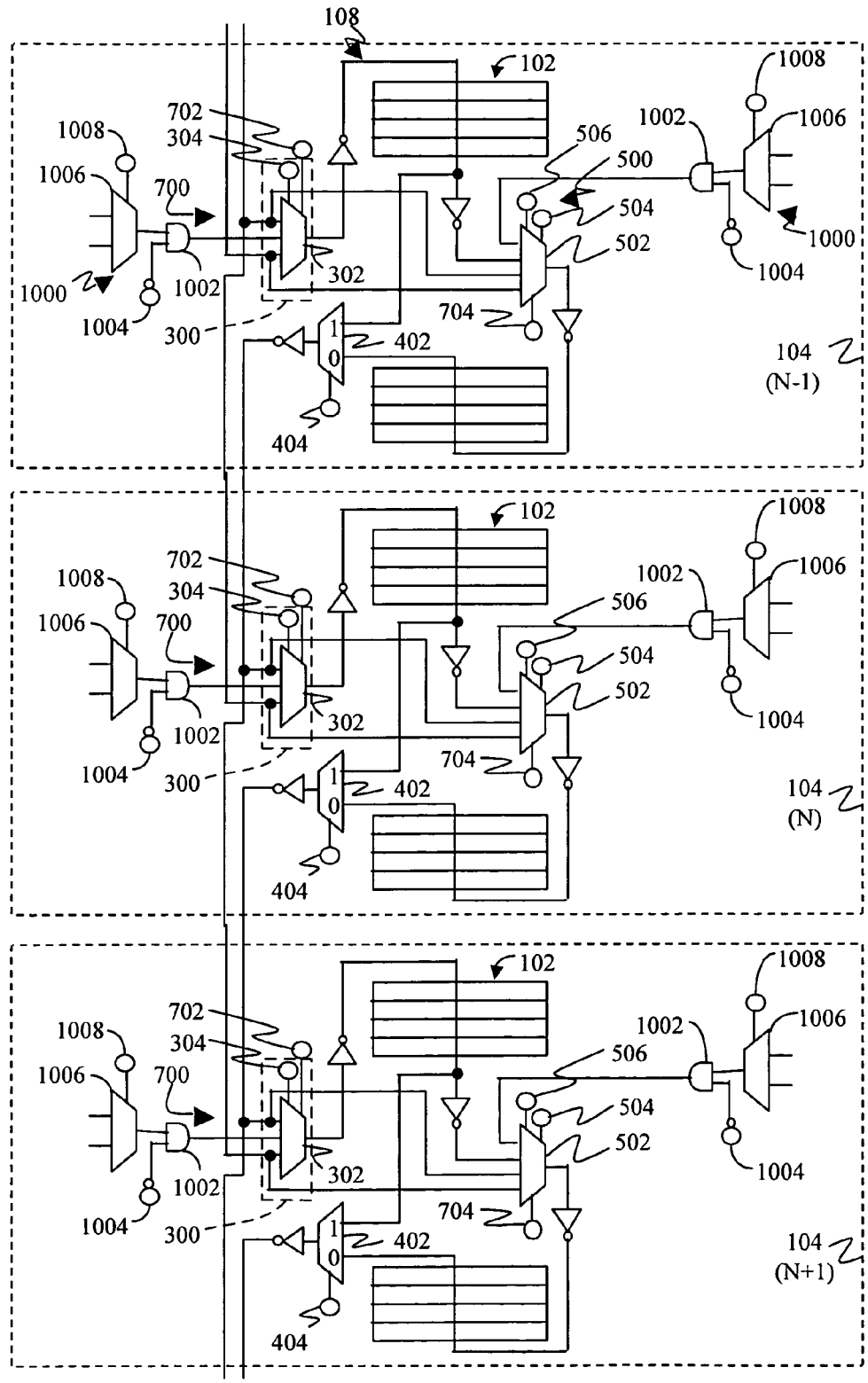

With reference to FIG. 10, in one exemplary embodiment, LAB 104 includes carry chain 108, first initialization circuit 300, second initialization circuit 500, and a redundancy circuit 700. In the present exemplary embodiment, carry chain 108 includes a bypass-able portion that is selectable between a first location and a second location within LAB 104. Additionally, in the present exemplary embodiment, initialization circuit 300 supports dynamic tie-off, meaning that the initialization value can be selected between values (e.g., a high or low value, a logic zero or one, etc.).

More particularly, in the present exemplary embodiment, initialization circuit 300 includes an initialization value selection circuit 1000 having logic components to select allow selection of an initialization value. As depicted in FIG. 10, initialization value selection circuit 1000 includes a logic gate 1002 connected to a RAM bit 1004 and a multiplexer 1006 connected to RAM bit 1008. In the present exemplary embodiment, RAM bit 1008 receives a selection signal from a LEIM input into LAB 104. Although logic gate 1002 is depicted in FIG. 10 as an AND gate, it should be recognized that logic gate 1002 can include various types and combinations of logic gates, such as a NAND gate.

Based on the selection signal received at RAM bit 1004 and RAM bit 1008, logic gate 1002 outputs an initialization value. For example, an initialization value of logic zero can be used as part of an addition function, and an initialization value of logic one can be used as part of a subtraction function.

Additionally, in the exemplary embodiment depicted in FIG. 10, multiplexer 1006 includes two inputs. Each input of multiplexer 1006 can be driven by a user controlled signal to allow dynamic control of the input signal polarity during user operation. The inputs of multiplexer 1006 can be connected to programmable routing structure, which allows logic element outputs or general routing to control the inputs into multiplexer 1006. It should be recognized that multiplexer 1006 can include any number of inputs (e.g., 1, 2, 3, or more), depending on the desired degree of routing flexibility.

As also depicted in FIG. 10, a first and second initialization value selection circuits 1000 are provided for initialization circuits 300 and 500, respectively. Thus, the first and second initialization value selection circuits 1000 can be used to initialize a first path and a second path of carry chain 108 with a selectable initialization value.

VI. Metal Layer Options and Carry Chain Initialization

Figure 11:
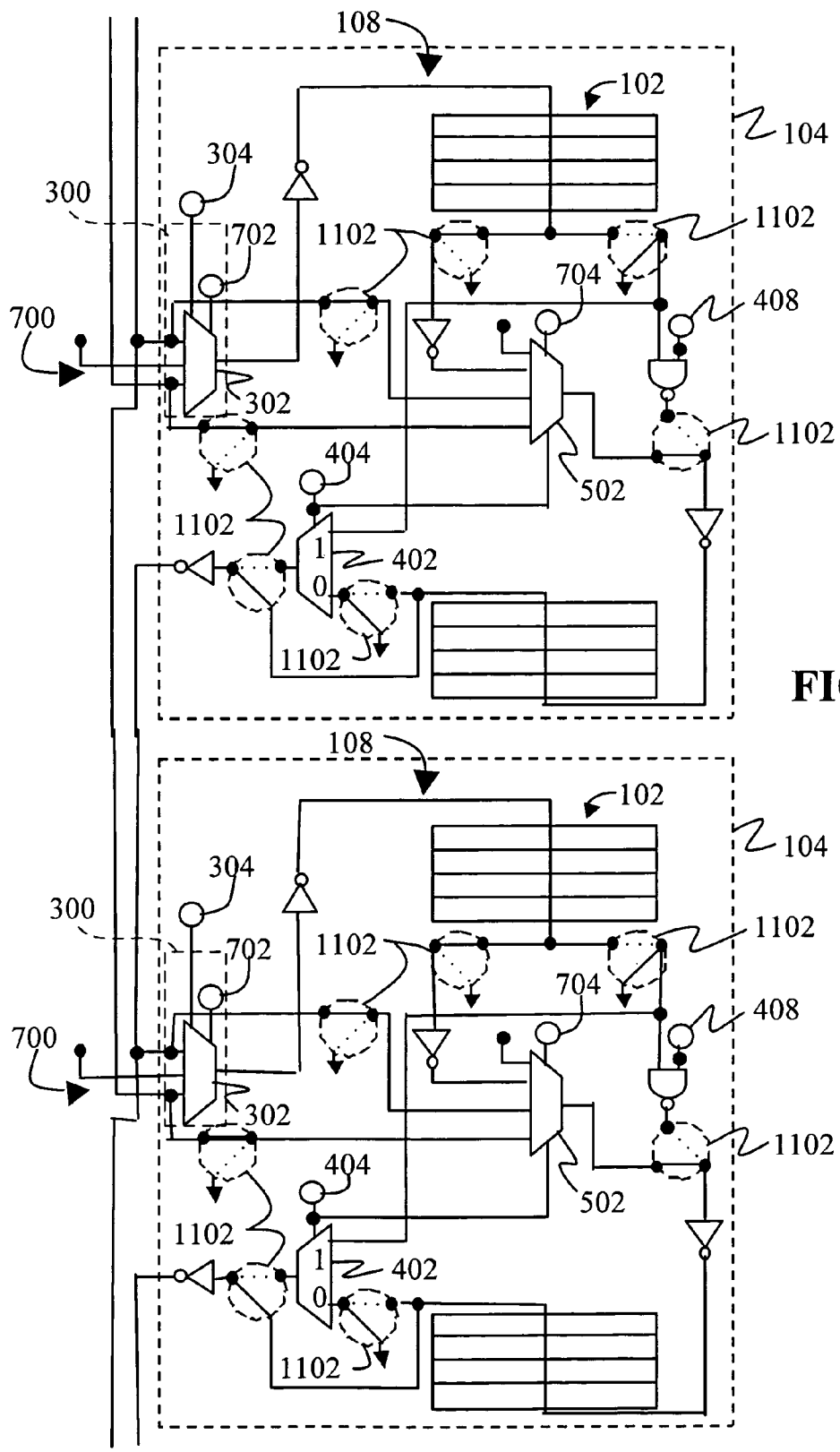

With reference to FIG. 11, in one exemplary embodiment, LAB 104 includes a carry chain 108 having metal layer option regions 1102. When the layout for LAB 104 is implemented, metal layer option regions 1102 can be formed in accordance with a first layout or a second layout. When metal layer option regions 1102 are formed in accordance with the first layout, the bypass-able region of carry chain 108 in LAB 104 is located in a first portion of LAB 104. When metal layer option regions 1102 are formed in accordance with the second layout, the bypass-able region of carry chain 108 in LAB 104 is located in a second portion of LAB 104.

For example, similar to the exemplary embodiment depicted in FIG. 8, in the exemplary embodiment depicted in FIG. 11, when metal layer option regions 1102 are formed with the solid lines, the bypass-able region of carry chain 108 in LAB 104 is located in the top portion of LAB 104. Similar to the exemplary embodiment depicted in FIG. 7, in the exemplary embodiment depicted in FIG. 11, when metal layer option regions 1102 are formed in accordance with the dashed lines, the bypass-able region of carry chain 108 in LAB 104 is located in the bottom portion of LAB 104. Thus, a generic layout can be used for LAB 104, where only the layout within metal layer option regions 1102 are altered to determine the location of the bypass-able portion of carry chain 108.

As described above, an exemplary PLD architecture includes an array of LABs 104. In one exemplary embodiment, the location of the bypass-able portion of carry chain 108 is alternated between columns of LABs 104. For example, in a first column of LABs 104, the bypass-able portion of carry chain 108 can be located at the top of the LABs 104. In a second column adjacent to the first column, the bypass-able portion of carry chain 108 can be located at the bottom of the LABs 104. Alternating the location of the bypass-able portion of carry chain 108 between columns of LABs 104 can more evenly distribute the load on horizontal lines connecting the columns of LABs 104.

In the present exemplary embodiment, carry chain 108 can be initialized at a first location and a second location with LAB 104. In the exemplary embodiment depicted in FIG. 11, carry chain 108 can be initialized at a first location using RAM bits 304 and at a second location using RAM bit 408.

VII. Adders

Figure 12:
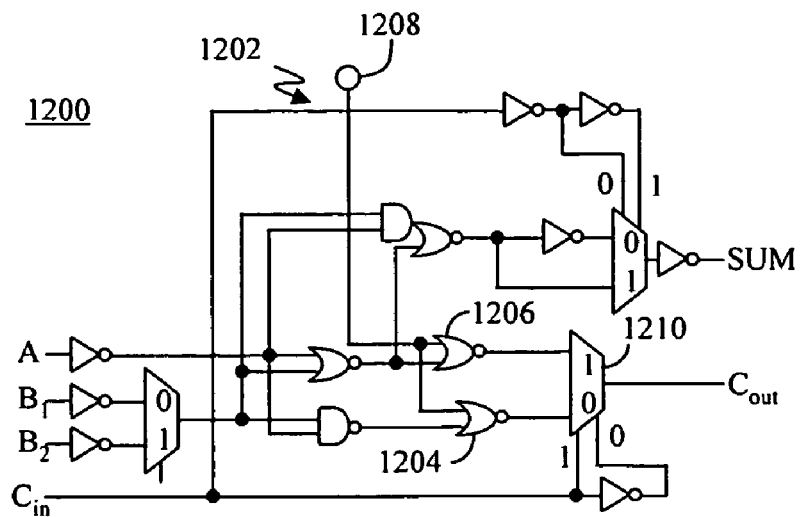
FIGS. 12–14 are block diagrams of exemplary adders in a LE.

With reference to FIG. 12, in one exemplary embodiment, an adder 1200 is depicted with an initialization circuit 1202. In the present exemplary embodiment, adder 1200 includes an inverted carry input ($C_{in}$) signal and a non-inverted carry out ($C_{out}$) signal. It should be recognized that adder 1200 can be implemented as dedicated adder 204 and/or dedicated adder 206 (FIG. 2) in LE 102 (FIG. 2). Because adder 1200 includes initialization circuit 1202, carry chain 108 (FIG. 3) in LAB 104 (FIG. 3) can be initialized and started at any LE 102 (FIG. 3) with adder 1200.

As depicted in FIG. 12, initialization circuit 1202 includes logic components to set carry out ($C_{out}$) signal to a logic zero. More particularly, in the present exemplary embodiment, initialization circuit 1202 includes logic gates 1204 and 1206 connected to a first input and a second input of a multiplexer 1210, which generates the $C_{out}$ signal. The logic gates 1204 and 1206 are connected to a RAM bit 1208, which receives an initialization signal. Although logic gates 1204 and 1206 are depicted in FIG. 12 as NOR gates, it should be recognized that logic gates 1204 and 1206 can include various types and combinations of logic gates, such as OR gates.

Figure 13:
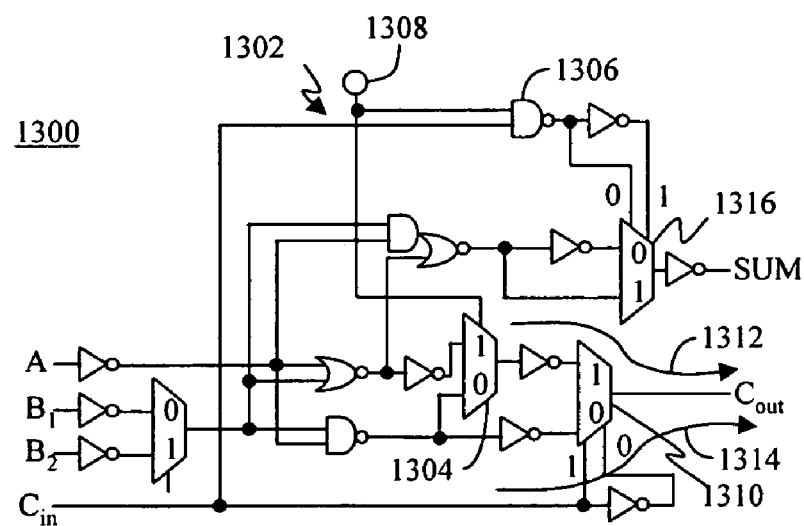

With reference to FIG. 13, in another exemplary embodiment, an adder 1300 is depicted with an initialization circuit 1302. In the present exemplary embodiment, adder 1300 includes a non-inverted $C_{in}$ signal and an inverted $C_{out}$ signal. Adder 1300 also includes a path 1312 optimized for pull-up and a path 1314 optimized for pull-down. It should be recognized that adder 1300 can be implemented as dedicated adder 204 and/or dedicated adder 206 (FIG. 2) in LE 102 (FIG. 2). Because adder 1300 includes initialization circuit 1302, carry chain 108 (FIG. 3) in LAB 104 (FIG. 3) can be initialized and started at any LE 102 (FIG. 3) with adder 1300.

As depicted in FIG. 13, initialization circuit 1302 includes logic components to set the $C_{out}$ signal to a logic zero. More particularly, in the present exemplary embodiment, initialization circuit 1302 includes a multiplexer 1304 having an output connected to the input of a multiplexer 1310, which generates the $C_{out}$ signal. Multiplexer 1304 is connected to a RAM bit 1308, which receives an initialization signal. Initialization circuit 1302 also includes a logic gate 1306 connected to a multiplexer 1316, which generates a SUM signal. Although logic gate 1306 is depicted in FIG. 13 as a NAND gate, it should be recognized that logic gate 1306 can include various types and combinations of logic gates, such as an AND gate.

As noted above, adders 1200 and/or 1300 can be implemented as dedicated adders 204 and/or 206 (FIG. 2) in LE 102 (FIG. 2). In one exemplary embodiment, in a LAB 104 (FIG. 2), adder 1200 is implemented as the adders in odd LEs 102 in LAB 104, and adder 1300 is implemented as the adders in even LEs 102 in LAB 104. It should be recognized, however, that adder 1200 can be implemented as the adders in even LEs 102, and adder 1300 can be implemented as the adders in odd LEs 102.

Figure 14:
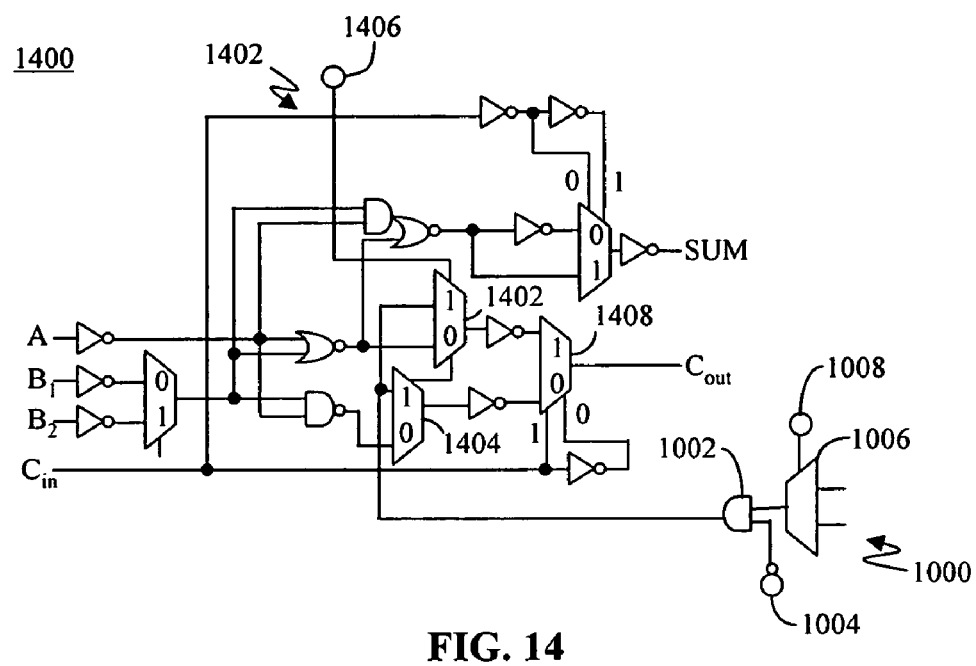

With reference to FIG. 14, in still another exemplary embodiment, an adder 1400 is depicted with an initialization circuit 1402. Adder 1400 also includes an initialization value selection circuit 1000. In the present exemplary embodiment, adder 1400 includes an inverted $C_{in}$ signal and a non-inverted $C_{out}$ signal. Because adder 1400 includes initialization circuit 1402, carry chain 108 (FIG. 3) in LAB 104 (FIG. 3) can be initialized and started at any LE 102 (FIG. 3) with adder 1400.

As depicted in FIG. 14, initialization circuit 1402 includes logic components to set the $C_{out}$ signal to an initialization value. More particularly, in the present exemplary embodiment, initialization circuit 1402 includes a multiplexer 1402 having an output connected to a first input of a multiplexer 1408, which generates the $C_{out}$ signal. Initialization circuit 1402 also includes a multiplexer 1404 having an output connected to a second input of multiplexer 1408.

Initialization value selection circuit 1000 includes logic components to select an initialization value. As depicted in FIG. 14, initialization value selection circuit 1000 includes a logic gate 1002 connected to a RAM bit 1004 and a multiplexer 1006 connected to RAM bit 1008. In the present exemplary embodiment, RAM bit 1008 receives a selection signal from an LEIM input into LAB 104. Although logic gate 1002 is depicted in FIG. 14 as an AND gate, it should be recognized that logic gate 1002 can include various types and combinations of logic gates, such as a NAND gate.

Based on the selection signal received at RAM bit 1004 and RAM bit 1008, logic gate 1002 outputs an initialization value. For example, an initialization value of logic zero can be used as part of an addition function, and an initialization value of logic one can be used as part of a subtraction function.

Additionally, in the exemplary embodiment depicted in FIG. 14, multiplexer 1006 includes two inputs. Each input of multiplexer 1006 can be driven by a user controlled signal to allow dynamic control of the input signal polarity during user operation. The inputs of multiplexer 1006 can be connected to programmable routing structure, which allows logic element outputs or general routing to control the inputs into multiplexer 1006. It should be recognized that multiplexer 1006 can include any number of inputs (e.g., 1, 2, 3, or more), depending on the desired degree of routing flexibility.

VIII. Data Processing System

Figure 15:
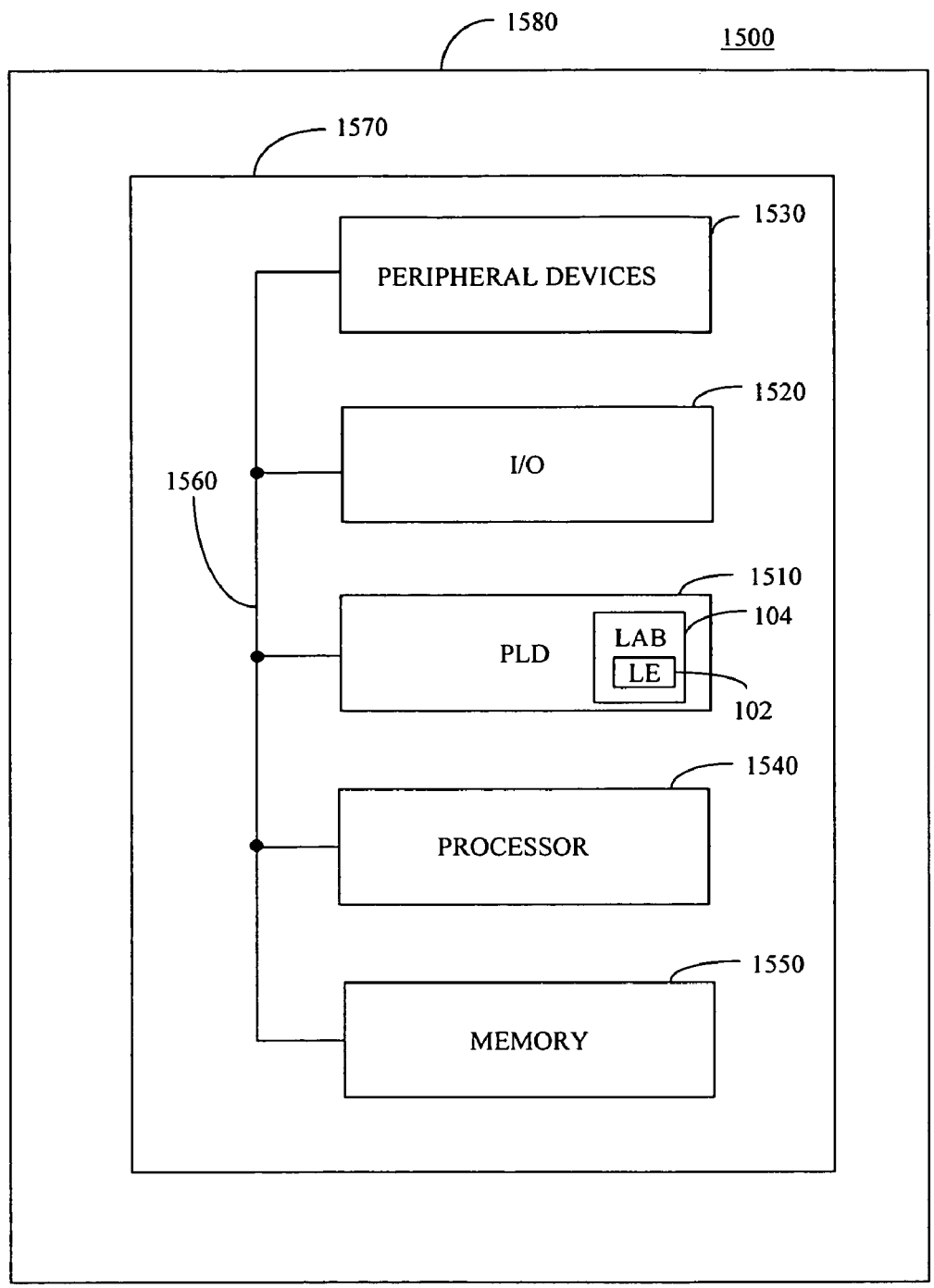
FIG. 15 is a block diagram of an exemplary data processing system.

With reference to FIG. 15, an exemplary PLD 1510 is depicted as a component of an exemplary data processing system 1500. PLD 1510 includes LABs 104 with LEs 102. (Only one LAB 104 and LE 102 are depicted to avoid overcomplicating the drawing.) Data processing system 1500 may include one or more of the following components: a processor 1540; memory 1550; input/out (I/O) circuitry 1520; and peripheral devices 1530. These components are coupled together by a system bus 1560 and are populated on a circuit board 1570, which is contained in an end-user system 1580.

It should be recognized that data processing system 1500 can be used in a wide variety of applications, such as computer networking, data networking, instrumentation, video processing, digital signal processing, or any other application where the advantage of using programmable or reprogrammable logic is desirable. PLD 1510 can be used to perform a variety of different logic functions. For example, PLD 1510 can be configured as a processor or controller that works in cooperation with processor 1540 (or, alternatively, a PLD can act as the sole system processor). PLD 1510 may also be used as an arbiter for arbitrating access to a shared resource in system 1500. In yet another example, PLD 1510 can be configured as an interface between processor 1540 and one of the other components in system 1500.

Although exemplary embodiments have been described, various modifications can be made without departing from the spirit and/or scope of the present invention. Therefore, the present invention should not be construed as being limited to the specific forms shown in the drawings and described above.

We claim:

1. A logic circuit comprising:
a first series of logic elements, each logic element having a look-up table and a dedicated adder to implement an arithmetic mode in the logic element;
a carry chain connecting the first series of logic element;
an initialization circuit connected to the carry chain to initialized the carry chain;
a multiplexer connected to a selection signal, the multiplexer having:
a first input connected to a carry in signal;
a second input connected to a power supply; and
an output connected to the carry chain; and
a logic circuit connected to the initialization circuit.

2. A programmable logic device including the logic circuit of claim 1.

3. A digital system comprising a programmable logic device including the logic circuit of claim 1.

4. A logic circuit comprising:
a first series of logic elements, each logic element having a look-up table and a dedicated adder to implement an arithmetic mode in the logic element;
a carry chain connecting the first series of logic element;
an initialization circuit connected to the carry chain to initialize the carry chain;
a first path connecting the first series of logic element;
a second path connecting a second series of logic elements,
wherein the logic elements in the first series are a subset of the logic elements in the second series; and
a logic circuit connected to the initialization circuit.

5. The logic circuit of claim 4, further comprising:
a first multiplexer having a first input and a second input, wherein when the first input is selected, a carry signal is propagated through the first series of logic elements, and
wherein when the second input is selected, the carry signal is propagated through the second series of logic elements.

6. The logic circuit of claim 5, wherein the initialization circuit comprises:
a first initialization circuit connected to the first path; and
a second initialization circuit connected to the second path.

7. The logic circuit of claim 6, wherein the first initialization circuit comprises:
a second multiplexer connected to a selection signal, the multiplexer having;
a first input connected to a carry in signal;
a second input connected to a power supply; and
an output connected to the carry chain.

8. The logic circuit of claim 7, wherein the second initialization circuit comprises:
a logic gate connected to an end of the first path and a beginning of the second path.

9. The logic circuit of claim 7, wherein the second initialization circuit comprises:
a third input of the first multiplexer connected to a power supply.

10. A logic circuit comprising:
a first series of logic elements, each logic element having a look-up table and a dedicated adder to implement an arithmetic mode in the logic element;
a carry chain connecting the first series of logic element;
an initialization circuit connected to the carry chain to initialize the carry chain; and
an initialization value selection circuit connected to the initialization circuit, wherein the initialization value selection circuit is configured to generate a logic zero or a logic one as an initialization value for the initialization circuit, the initialization value selection circuit further comprising:
a logic gate connected to the initialization circuit; and
a multiplexer connected to the logic gate.

11. The logic circuit of claim 10, wherein the multiplexer includes one or more inputs.

12. A logic circuit comprising:
a first series of logic elements, each logic element having a look-up table and a dedicated adder to implement an arithmetic mode in the logic element;
a carry chain connecting the first series of logic element; and
an initialization circuit connected to the carry chain to initialize the carry chain, wherein the initialization circuit is disposed within the adder in a logic element;
wherein the dedicated adder includes:
an inverted carry input signal,
a non-inverted carry inputs signal, and
a non-inverted carry out signal, and
a multiplexer that generates the non-inverted carry out signal; and
wherein the initialization circuit includes;
a first logic gate connected to a first input of the multiplexer,
a second logic gate connected to second input of the multiplexer, and
wherein the first and second logic gates are connected to an initialization signal.

13. The logic circuit of claim 12,
wherein the adder includes:
a non-inverted carry input signal,
an inverted carry out signal,
a first multiplexer that generates the inverted carry out signal,
and a second multiplexer that generates a sum; and
wherein the initialization circuit includes;
a third multiplexer with an output connected to a first input of the first multiplexer and an input connected to a second input of the first multiplexer,
a logic gate connected to the second multiplexer, and
wherein the third multiplexer and the logic gate are connected to an initialization signal.

14. The logic circuit of claim 12, further comprising;
a initiation value selection circuit connected to the initialization circuit, wherein the initialization value selection circuit is configured to allow selection of an initialization value for the initialization circuit.

15. The logic circuit of claim 14, wherein the initialization value can be set to a high or low value.

16. The logic circuit of claim 14, wherein the initialization value can be changed between a light value and a low value.

17. The logic circuit of claim 14,
wherein the adder includes;
a inverted carry input signal
a non-inverted carry out signal, and
a first multiplexer that generates the non-inverted carry out signal; and
wherein the initialization circuit includes:
a second multiplexer having an output connected to a first input of the first multiplexer,
a third multiplexer having an output connected to a second input of the first multiplexer, and
wherein the first and second multiplexers are connected to an initialization signal and the initialization value selection circuit; and
wherein the initialization value selection circuit includes:
a logic gate connected to the initialization circuit, and
a multiplexer connected to the logic gate.

18. A programmable logic device comprising:
an array of logic elements grouped into a plurality of logic blocks;
a first series of logic elements disposed within a logic block, each logic element having a look-up table and a dedicated adder to implement an arithmetic mode in the logic element;
a carry chain connecting the first series of logic element;
an initialization circuit connected to the carry chain to initialize the carry chain;
a first path connecting the first series of logic elements;
a second path connecting a second series of logic elements,
wherein the logic elements in the first series are a subset of the logic elements in the second series; and
a logic circuit connected to the initialization circuit.

19. The programmable logic device of claim 18, wherein the initialization circuit comprises:
a first initialization circuit connected to the first path; and
a second initialization circuit connected to the second path.

20. A digital system comprising a programmable logic device including the logic circuit of claim 18.

21. A programmable logic device comprising:
an array of logic elements grouped into a plurality of logic blocks;
a first series of logic elements disposed within a logic block, each logic element having a look-up table and a dedicated adder to implement an arithmetic mode in the logic element;
a carry chain connecting the first series of logic elements;
an initialization circuit connected to the carry chain to initialize the carry chain;
an initialization value selection circuit connected to the initialization circuit, wherein the initialization value selection circuit is configured to selection of an initialization value for the initialization circuit, and wherein the initialization value can be set to a high or low value; and
a logic circuit connected to the initialization circuit.

22. The programmable logic device of claim 21, wherein the initialization value can be changed between a high value and a low value.

23. A programmable logic device comprising:
an array of logic elements grouped into a plurality of logic blocks;
a first series of logic elements disposed within a logic block, each logic element having a look-up table and a dedicated adder to implement an arithmetic mode in the logic element;
a carry chain connecting the first series of logic element; and
an initialization circuit connected to the carry chain to initialize the carry chain,
wherein the initialization circuit is disposed within the adder in logic element; and
wherein the adder includes:
an inverted carry input signal,
a non-inverted carry out signal, and
a multiplexer that generates the non-inverted carry out signal: and
wherein the initialization circuit includes:
a first logic gate connected to a first input of the multiplexer,
a second logic gate connected to a second input of the multiplexer, and
wherein the first and second logic gates are connected to an initialization signal.

24. The programmable logic device of claim 23,
wherein the adder includes:
a non-inverted carry input signal,
an inverted carry out signal,
a first multiplexer that generates the inverted carry out signal,
a second multiplexer that generates a sum; and
wherein the initialization circuit includes:
a third multiplexer with an output connected to a first input of the first multiplexer and an input connected to a second input of the first multiplexer,
a logic gate connected to the second multiplexer, and
wherein the third multiplexer and the logic gate are connected to an initialization signal.

25. The programmable logic device of claim 23, further comprising:
an initialization value selection circuit connected to the initialization circuit, wherein the initialization value selection circuit is configured to allow selection of an intialization value for the initialization circuit.

26. The programmable logic device of claim 25, wherein the adder includes:
   a inverted carry input signal,
   a non-inverted carry out signal, and
   a first multiplexer that generates the non-inverted carry out signal; and
wherein the initialization circuit includes:
   a second multiplexer having an output connected to a first input of the first multiplexer,
   a third multiplexer having an output connected to a second input of the first multiplexer,
   wherein the first and second multiplexers are connected to an initialization signal and the initialization value selection circuit; and
wherein the initialization value selection circuit includes:
a logic gate connected to the initialization circuit, and
a multiplexer connected to the logic gate.

27. A method of initializing a carry chain in a programmable logic device, the method comprising:
   implementing an arithmetic mode in a logic element using a dedicated adder in the logic element, wherein a series of logic elements are connected as carry chain;
   initializing the carry chain using an initialization circuit connected to the carry chain; and
   generating a logic zero or a logic one as an initialization value for the initialization circuit using an initialization value selection circuit connected to the initialization circuit, the initialization value selection circuit further comprising:
      a logic gate connected to the initialization circuit; and
      a multiplexer connected to the logic gate.

* * * * *

UNITED STATES PATENT AND TRADEMARK OFFICE
CERTIFICATE OF CORRECTION

PATENT NO. : 7,061,268 B1 Page 1 of 1
APPLICATION NO. : 10/801242
DATED : June 13, 2006
INVENTOR(S) : Lee et al.

It is certified that error appears in the above-identified patent and that said Letters Patent is hereby corrected as shown below:

In the Claims:

Column 13, line 16 change "initiation" to --initialization--.

Column 14, line 12 delete "and".

Signed and Sealed this

Twelfth Day of June, 2007

JON W. DUDAS
*Director of the United States Patent and Trademark Office*